(12) United States Patent
Tokuhara et al.

(10) Patent No.: US 10,910,467 B2
(45) Date of Patent: Feb. 2, 2021

(54) CAPACITOR INCLUDING FIRST ELECTRODE, DIELECTRIC LAYER, AND SECOND ELECTRODE, IMAGE SENSOR, METHOD FOR MANUFACTURING CAPACITOR, AND METHOD FOR MANUFACTURING IMAGE SENSOR

(71) Applicant: Panasonic Intellectual Property Management Co., Ltd., Osaka (JP)

(72) Inventors: Takeyoshi Tokuhara, Osaka (JP); Satoshi Shibata, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 16/801,580

(22) Filed: Feb. 26, 2020

(65) Prior Publication Data

US 2020/0194541 A1    Jun. 18, 2020

Related U.S. Application Data

(63) Continuation of application No. 16/111,260, filed on Aug. 24, 2018, now Pat. No. 10,615,247.

(30) Foreign Application Priority Data

Sep. 12, 2017  (JP) ................. 2017-175112

(51) Int. Cl.
*H01L 49/02* (2006.01)
*H01L 21/02* (2006.01)
(Continued)

(52) U.S. Cl.
CPC .......... *H01L 28/40* (2013.01); *H01L 21/0228* (2013.01); *H01L 21/02181* (2013.01);
(Continued)

(58) Field of Classification Search
None
See application file for complete search history.

(56) References Cited

U.S. PATENT DOCUMENTS

2002/0074584 A1* 6/2002 Yang ................. G11C 11/404
257/300
2003/0003635 A1* 1/2003 Paranjpe ........... H01L 21/02178
438/149
(Continued)

FOREIGN PATENT DOCUMENTS

JP   2004-055813 A    2/2004
JP   2006-270123 A   10/2006
(Continued)

OTHER PUBLICATIONS

Non-Final Office Action issued in corresponding U.S. Appl. No. 16/111,260, dated Jun. 27, 2019.
(Continued)

*Primary Examiner* — Anthony Ho
*Assistant Examiner* — Kevin Quinto
(74) *Attorney, Agent, or Firm* — McDermott Will & Emery LLP

(57) ABSTRACT

A capacitor includes a first electrode; a second electrode facing the first electrode; and a dielectric layer which is disposed between the first electrode and the second electrode. The dielectric layer is made of at least one selected from the group consisting of a hafnium oxide and a zirconium oxide. A thickness of the dielectric layer is 12 nm or more. The dielectric layer has a monoclinic crystal system structure. A concentration of hydrogen in the dielectric layer is $2.5\times10^{21}$ atoms/cm$^3$ or less.

15 Claims, 12 Drawing Sheets

(51) Int. Cl.
*H01L 27/30* (2006.01)
*H01L 27/146* (2006.01)

(52) U.S. Cl.
CPC .. *H01L 21/02189* (2013.01); *H01L 21/02337* (2013.01); *H01L 21/02356* (2013.01); *H01L 27/14609* (2013.01); *H01L 27/14692* (2013.01); *H01L 27/307* (2013.01); *H01L 27/1469* (2013.01); *H01L 27/14634* (2013.01)

(56) References Cited

U.S. PATENT DOCUMENTS

| | | |
|---|---|---|
| 2004/0012047 A1 | 1/2004 | Lin et al. |
| 2008/0036888 A1 | 2/2008 | Sugawa et al. |
| 2009/0085029 A1 | 4/2009 | Mitsui et al. |
| 2011/0114376 A1 | 5/2011 | Shoji et al. |
| 2012/0064689 A1 | 3/2012 | Hirota et al. |
| 2016/0190188 A1 | 6/2016 | Murakami et al. |

FOREIGN PATENT DOCUMENTS

| | | |
|---|---|---|
| JP | 2011-044577 A | 3/2011 |
| JP | 2012-080094 A | 4/2012 |
| JP | 2016-076921 A | 5/2016 |
| JP | 2016-181935 A | 10/2016 |
| JP | 2017-046333 A | 3/2017 |

OTHER PUBLICATIONS

Notice of Allowance issued in corresponding U.S. Appl. No. 16/111,260, dated Jan. 17, 2020.

\* cited by examiner

CAPACITOR INCLUDING FIRST ELECTRODE, DIELECTRIC LAYER, AND SECOND ELECTRODE, IMAGE SENSOR, METHOD FOR MANUFACTURING CAPACITOR, AND METHOD FOR MANUFACTURING IMAGE SENSOR

CROSS-REFERENCE OF RELATED APPLICATIONS

This application is a Continuation of U.S. patent application Ser. No. 16/111,260, filed on Aug. 24, 2018, which in turn claims the benefit of Japanese Patent Application No. 2017-175112, filed on Sep. 12, 2017, the entire disclosures of which Applications are incorporated by reference herein.

BACKGROUND

1. Technical Field

The present disclosure relates to a capacitor, an image sensor, a method for manufacturing a capacitor, and a method for manufacturing an image sensor.

2. Description of the Related Art

In recent years, a capacitor having a metal insulator-metal (MIM) structure has been known. For example, Japanese Unexamined Patent Application Publication Nos. 2016-76921 and 2006-270123 each have disclosed a capacitor including an insulating film formed using a material, such as $ZrO_2$, having a high dielectric constant.

SUMMARY

In one general aspect, the techniques disclosed here feature a capacitor comprising: a first electrode; a second electrode facing the first electrode; and a dielectric layer which is disposed between the first electrode and the second electrode. The dielectric layer is made of at least one selected from the group consisting of a hafnium oxide and a zirconium oxide. A thickness of the dielectric layer is 12 nm or more. The dielectric layer has a monoclinic crystal system structure. A concentration of hydrogen in the dielectric layer is $2.5 \times 10^{21}$ atoms/cm$^3$ or less.

It should be noted that general or specific embodiments may be implemented as an element, a device, an apparatus, a system, an integrated circuit, or a manufacturing method of each of those mentioned above. In addition, the general or specific embodiments may also be implemented as an arbitrary combination among an element, a device, an apparatus, a system, an integrated circuit, and a manufacturing method of each of those mentioned above.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

Figure 1:
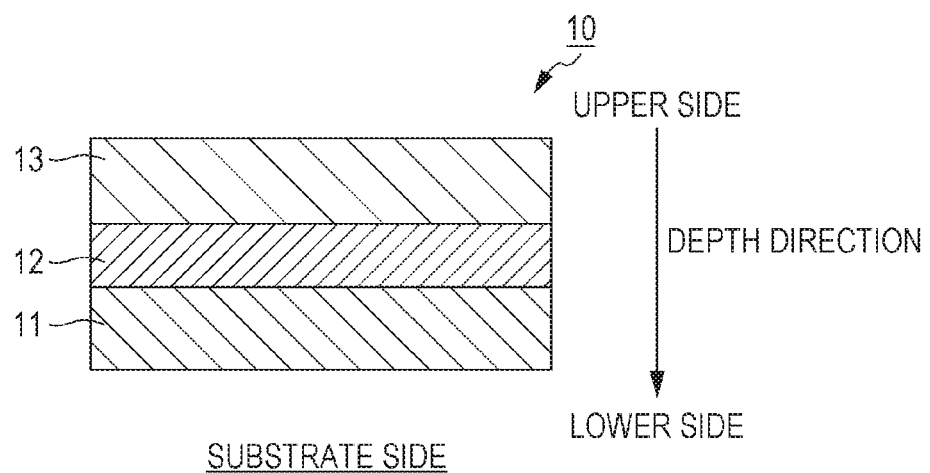
FIG. 1 is a cross-sectional view showing an exemplary structure of a capacitor according to an embodiment.

DETAILED DESCRIPTION (Underlying Knowledge Forming Basis of the Present Disclosure)

In recent years, a semiconductor device formed using a material having a high dielectric constant, that is, a so-called high-k material, has been known. For example, a high-k material has been used for a gate oxide film of a metal oxide semiconductor (MOSFET), a memory cell of a dynamic random access memory (DRAM), or the like.

As the high-k material, for example, HfSiON, $HfO_2$, or $ZrO_2$ may be mentioned. When the high-k material is used as a dielectric layer of a capacitor, compared to the case in which $SiO_2$ is used, while a high capacity is secured, a physical film thickness of the dielectric layer can be increased. Hence, while the increase in tunnel current in association with the reduction in film thickness is suppressed, an increase in capacity of the capacitor can be realized.

In addition, in a complementary metal oxide semiconductor (CMOS) image sensor which includes photoelectric conversion films laminated to each other, a capacitor including a dielectric layer formed using a high-k material is also used.

However, a related capacitor has problems in that the leak current is large, and the insulating property is inferior.

For example, in the above Japanese Unexamined Patent Application Publication No. 2016-76921, a capacitor having a large capacity is used as an element which stores charges generated in a photoelectric conversion film and converts the amount of charges thus stored to the voltage.

When the capacitor is used as a charge storage element of an image sensor, the leak current of the capacitor functions to reduce the amount of charges to be stored or to increase noise. In addition, the noise level of the image sensor is approximately several electrons even at a lower level. Hence, compared to the other semiconductor devices, an improvement in insulating property of the capacitor is particularly required. Accordingly, as a capacitor used for the image sensor, compared to a gate insulating film of a MOSFET and an insulating film used for a memory cell of a DRAM, a capacitor including a relatively thick insulating film may be used.

However, in the image sensor, as disclosed in Japanese Unexamined Patent Application Publication No. 2016-76921, as a circuit element forming a signal processing circuit, many MOSFETs each formed along the interface of a silicon (Si) substrate are used. At the interface of the Si substrate, dangling bonds of Si cause the change of characteristics and the degradation thereof. Hence, a heat treatment is performed on the Si substrate in a hydrogen atmosphere, so that the dangling bonds are hydrogen-terminated.

However, when a capacitor is formed at an upper side of the Si substrate which is processed by a heat treatment in a hydrogen atmosphere, in a film formation step or an etching step using plasma, some hydrogen atoms may be eliminated from the interface of the Si substrate in some cases. Hence, in order to recover the characteristics of MOSFETs, it is believed that after the formation of the capacitor, a heat treatment in a hydrogen atmosphere is also required.

In addition, Japanese Unexamined Patent Application Publication No. 2006-270123 has disclosed that in a non-oxidizing atmosphere including a hydrogen atmosphere, when a heat treatment is performed on the capacitor at a temperature forming the insulating film or more, the insulating property can be enhanced.

However, the present inventors found that the method disclosed in Japanese Unexamined Patent Application Publication No. 2006-270123 can be effective only when the physical film thickness of the insulating film is small. The present inventors discovered that when the film thickness of the insulating film was large, by a heat treatment performed in a hydrogen atmosphere, the leak current of the capacitor was remarkably increased.

Hence, when the heat treatment is performed after the capacitor is formed, the insulating property of the capacitor is disadvantageously degraded. Accordingly, there has been a problem in that while the characteristics of a MOSFET provided in a Si substrate are improved, the insulating property of the capacitor cannot be improved.

Aspects of the present disclosure are as described below.

A capacitor according to one aspect of the present disclosure comprises: a first electrode; a second electrode facing the first electrode; and a dielectric layer which is disposed between the first electrode and the second electrode. The dielectric layer is made of at least one selected from the group consisting of a hafnium oxide and a zirconium oxide. A thickness of the dielectric layer is 12 nm or more. The dielectric layer has a monoclinic crystal system structure. A concentration of hydrogen in the dielectric layer is $2.5 \times 10^{21}$ atoms/cm$^3$ or less. The dielectric layer may contain, as a main component, at least one selected from the group consisting of a hafnium oxide and a zirconium oxide. The dielectric layer may be in contact with the first electrode and the second electrode.

Accordingly, the leak current is decreased, and a capacitor having a high insulating property is realized.

In addition, an image sensor according to another aspect of the present disclosure comprises: at least one selected from the group consisting of a photoelectric converter and a photodiode; and the capacitor described above.

Accordingly, since the image sensor includes a capacitor having a high insulating property, the characteristics of the image sensor can be enhanced. For example, when the image sensor includes a capacitor as an element which stores signal charges, the noise caused by the capacitor can be reduced. Hence, an image sensor having a high accuracy and a high reliability can be realized. In addition, when the image sensor includes a capacitor as a constituent element of a feedback circuit which reduces kTC noise, the reduction in kTC noise can be effectively carried out. Hence, an image sensor having a high accuracy and a high reliability can be realized.

In addition, a method for manufacturing a capacitor according to another aspect of the present disclosure comprises: a step of laminating a first electrode, a dielectric layer which is made of at least one selected from the group consisting of a hafnium oxide and a zirconium oxide and which has a film thickness of 12 nm or more, and a second electrode in this order; after at least a part of the dielectric layer is laminated, a step of performing a first heat treatment in an atmosphere excluding hydrogen or a reduced pressure atmosphere at $10^{-2}$ Pa or less; and after the second electrode is laminated, a step of performing a second heat treatment in a hydrogen atmosphere. The dielectric layer may contain, as a main component, at least one selected from the group consisting of a hafnium oxide and a zirconium oxide.

Accordingly, since the first heat treatment is performed in an atmosphere excluding hydrogen or a reduced pressure atmosphere at $10^{-2}$ Pa or less before or after the second heat treatment in a hydrogen atmosphere, the leak current of the capacitor can be suppressed. Hence, a capacitor having a high insulating property can be manufactured.

In addition, for example, in the laminating step described above, while the first heat treatment is performed, the second electrode may be laminated.

Accordingly, since the first heat treatment and the lamination of the second electrode can be performed in the same chamber, without increasing the number of steps, a capacitor having a high insulating property can be manufactured.

In addition, for example, in the laminating step described above, the second electrode may be laminated using an atomic layer deposition method (ALD method).

Accordingly, since the first heat treatment and the lamination of the second electrode can be performed in the same chamber, without increasing the number of steps, a capacitor having a high insulating property can be manufactured. In addition, since an ALD method is used, the second electrode is formed to have a uniform thickness and a uniform quality, and hence a capacitor having a high reliability can be manufactured.

In addition, for example, the first heat treatment may be performed after the dielectric layer is laminated and before the second electrode is laminated.

Accordingly, a capacitor having a high insulating property can be manufactured.

In addition, for example, the first heat treatment may be performed after the second electrode is laminated and before the second heat treatment is performed.

Accordingly, since the first heat treatment and the second heat treatment can be performed in the same chamber, without increasing the number of steps, a capacitor having a high insulating property can be manufactured.

In addition, for example, the first heat treatment may be performed after the second heat treatment is performed.

Accordingly, for example, since the second heat treatment and the first heat treatment can be performed in the same chamber, without increasing the number of steps, a capacitor having a high insulating property can be manufactured.

In addition, for example, in the laminating step described above, the second electrode may be laminated at a temperature of 300° C. or less using a sputtering method.

Accordingly, since the second electrode is formed in a short time using a sputtering method, the time required for manufacturing the capacitor can be reduced.

In addition, for example, in the laminating step described above, the dielectric layer may be laminated on the first electrode at a temperature of 300° C. or less using an atomic layer deposition method.

Accordingly, since the dielectric layer is formed using an ALD method to have a uniform thickness and a uniform quality, a capacitor having a high reliability can be manufactured.

In addition, for example, in the laminating step described above, a precursor of the dielectric layer may be supplied at a temperature of 300° C. or less using an atomic layer deposition method, and the first heat treatment may be performed after the supply of the precursor is completed.

Accordingly, for example, since the first heat treatment can be performed in the chamber which is used for the ALD method, without increasing the number of steps, a capacitor having a high insulating property can be manufactured.

In addition, for example, the first heat treatment may be performed at a temperature of 350° C. or more.

Accordingly, within the minimum necessary thermal budget, a capacitor having a high insulating property can be manufactured.

In addition, a method for manufacturing an image sensor according to another aspect of the present disclosure, comprises: a step of laminating a first electrode, a dielectric layer which is made of at least one selected from the group consisting of a hafnium oxide and a zirconium oxide and which has a film thickness of 12 nm or more, and a second electrode in this order; after at least a part of the dielectric layer is laminated, a step of performing a first heat treatment in an atmosphere excluding hydrogen or a reduced pressure atmosphere at $10^{-2}$ Pa or less; after the second electrode is laminated, a step of performing a second heat treatment in a hydrogen atmosphere; and after the first heat treatment and the second heat treatment are performed, a step of forming a photoelectric conversion film containing an organic material. The dielectric layer may contain, as a main component, at least one selected from the group consisting of a hafnium oxide and a zirconium oxide.

The method for manufacturing an image sensor according to the above aspect of the present disclosure may further comprise: after the second heat treatment is performed, a step of forming a thin film transistor.

In addition, a method for manufacturing an image sensor according to another aspect of the present disclosure, comprises: a step of laminating a first electrode, a dielectric layer which is made of at least one selected from the group consisting of a hafnium oxide and a zirconium oxide and which has a thickness of 12 nm or more, and a second electrode in this order; after at least a part of the dielectric layer is laminated, a step of performing a first heat treatment in an atmosphere excluding hydrogen or a reduced pressure atmosphere at $10^{-2}$ Pa or less; after the second electrode is laminated, a step of performing a second heat treatment in a hydrogen atmosphere; and a step of adhering a first semiconductor substrate in which a photodiode is formed to a second semiconductor substrate in which a signal processing circuit is formed. The adhering step is performed before at least one selected from the group consisting of the first heat treatment and the second heat treatment. The dielectric layer may contain, as a main component, at least one selected from the group consisting of a hafnium oxide and a zirconium oxide.

Hereinafter, with reference to the drawings, embodiments of the present disclosure will be described in detail. In addition, the following embodiments each show a general or a specific example. The numerical values, the shapes, the materials, the constituent elements, the arrangement and connection modes of the constituent elements, the manufacturing steps, the order of the manufacturing steps, and the like in the following embodiments are described by way of example and are not intended to limit the present disclosure. Various modes to be described in this specification may be used in combination as long as no contradiction is generated. In addition, among the constituent elements of the following embodiments, constituent elements which are not described in independent claims, each of which indicate the topmost concept, will be described as arbitrary constituent elements.

In addition, the drawings are each a schematic view and are not accurately drawn. Hence, for example, the reduction scales and the like are not equal to each other in the respective drawings. In addition, in the respective drawings, constituent elements having substantially the same function are designated by the same reference numeral, and description thereof may be omitted or simplified in some cases.

In addition, in this specification, the terms "upper side" and "lower side" do not represent the upper direction (vertically upper side) and the lower direction (vertically lower side), respectively, in the absolute space recognition and are used as the terms defining a relative positional relationship based on the lamination order of the laminate structure. In addition, the terms "upper side" and "lower side" are not only used in the case in which between two constituent elements disposed with a space therebetween, another constituent element is provided but are also used in the case in which two constituent elements are disposed so as to be in tight contact with each other.

EMBODIMENTS

FIG. 1 is a cross-sectional view showing an exemplary structure of a capacitor 10 of an embodiment.

As shown in FIG. 1, the capacitor 10 includes a lower electrode 11, a dielectric layer 12, and an upper electrode 13. The capacitor 10 is formed by laminating the lower electrode 11, the dielectric layer 12, and the upper electrode 13 in this order at an upper side of a substrate (not shown).

The lower electrode 11 and the upper electrode 13 are examples of the first electrode and the second electrode disposed to face each other. The dielectric layer 12 is located between the lower electrode 11 and the upper electrode 13 and is in contact with each of the lower electrode 11 and the upper electrode 13.

As shown in FIG. 1, the capacitor 10 is a parallel plate type capacitor. In particular, the lower electrode 11, the dielectric layer 12, and the upper electrode 13 are each formed to have a flat shape having an approximately uniform film thickness. The lower electrode 11 and the upper electrode 13 are disposed in parallel to each other with the dielectric layer 12 interposed therebetween. An upper surface of the lower electrode 11 is in contact with a lower surface of the dielectric layer 12. A lower surface of the upper electrode 13 is in contact with an upper surface of the dielectric layer 12.

In addition, an electrode area of the capacitor 10 corresponds to an area at which the upper electrode 13 and the lower electrode 11 are overlapped with each other when viewed in plan. The term "when viewed in plan" indicates that the capacitor 10 is viewed in a lamination direction. The lamination direction is a direction opposite to the depth direction shown in FIG. 1, that is, is a direction from the lower side toward the upper side.

The lower electrode 11 is one example of the first electrode of the capacitor 10. The lower electrode 11 is formed using an electrically conductive material. As the electrically conductive material, a metal element, such as titanium (Ti), aluminum (Al), gold (Au), or platinum (Pt), may be used. Alternatively, as the electrically conductive material, for example, there may be used an electrically conductive nitride, such as titanium nitride (TiN), tantalum nitride (TaN), or hafnium nitride (HfN). In addition, as the electrically conductive material, an electrically conductive oxide, such as indium tin oxide (ITO) or zinc oxide (ZnO) may also be used.

The lower electrode 11 is formed, for example, using a metal organic chemical vapor deposition (MOCVD) method, an atomic layer deposition (ALD) method, or a sputtering method. The lower electrode 11 is formed, for example, to have a small film thickness using an electrically conductive material at an upper side of the substrate. The film thickness of the lower electrode 11 is, for example, 30 nm but is not limited thereto.

The upper electrode 13 is one example of the second electrode of the capacitor 10. The upper electrode 13 may be formed using the same material as that for the lower electrode 11 or a different material therefrom. The upper electrode 13 is formed, as is the case of the lower electrode 11, using an MOCVD method, an ALD method, a sputtering method, or the like. The upper electrode 13 is formed, for example, to have a small film thickness using an electrically conductive material in a region on the dielectric layer 12 and a region overlapped with the lower electrode 11 when viewed in plan. The film thickness of the upper electrode 13 is, for example, 200 nm but is not limited thereto.

The dielectric layer 12 is formed using a high-k material having a dielectric constant higher than that of silicon oxide ($SiO_2$). In particular, the dielectric layer 12 contains, as a main component, at least one selected from the group consisting of a hafnium (Hf) oxide and a zirconium (Zr) oxide. The dielectric layer 12 contains 50 mole % or more of at least one selected from the group consisting of a hafnium oxide and a zirconium oxide. The dielectric layer 12 is formed using an ALD method, an EB (electron beam) method, or the like. The dielectric layer 12 is formed, for example, to have a small film thickness using at least one selected from the group consisting of a hafnium oxide and a zirconium oxide on the lower electrode 11.

The film thickness of the dielectric layer 12 is 12 nm or more. The film thickness of the dielectric layer 12 may be, for example, 12 nm to 50 nm. The dielectric layer 12 has a monoclinic crystal system structure. The dielectric layer 12 contains hydrogen (H). The concentration of hydrogen contained in the dielectric layer 12 is $2.5 \times 10^{21}$ atoms/cm$^3$ or less.

The film thickness of the dielectric layer 12 can be obtained, for example, by measuring a physical film thickness of a photo taken by a transmission electron microscope. Alternatively, when the area (S) of the capacitor 10 and the dielectric constant (E) of the dielectric layer 12 are known, the average film thickness (d) can be obtained based on the following equation (1) using the capacity (C) of the capacitor 10.

$$d = \frac{\varepsilon S}{C} \tag{1}$$

The crystalline structure of the dielectric layer 12 can be obtained by performing an analysis using an X-ray diffraction (XRD) method. In this case, as the incident light, radiation light having high energy may also be used. In addition, the crystalline structure may also be obtained by a cross-sectional transmission electron microscope (TEM).

The concentration of hydrogen contained in the dielectric layer 12 can be measured, for example, using a time-of-flight secondary ion mass spectrometry (ToF-SIMS). In addition, the methods for measuring the film thickness, the crystalline structure, and the concentration of hydrogen of the dielectric layer 12 are not limited to those described above.

Hereinafter, with reference to examples of particular element structures, the capacitor 10 according to this embodiment will be described in detail with reference to the drawings.

The present inventors formed a plurality of capacitors 10 as samples and evaluated the characteristics using those samples. Among the samples, capacitors 10 in which the dielectric layers 12 have different thicknesses were included. In addition, the common conditions of the samples are as described below.

The capacitors 10 formed by the present inventors each have the structure in which the lower electrode 11, the dielectric layer 12, and the upper electrode 13 are laminated in this order on a Si substrate having a surface on which a thermal oxide film is provided. The lower electrode 11 is a TiN film having a thickness of 30 nm formed by an MOCVD method. The dielectric layer 12 is a film formed of a hafnium oxide ($HfO_x$) using an ALD method at a substrate temperature of 250° C. The upper electrode 13 is a Pt film having a thickness of 100 nm formed by an EB deposition method. In this case, at least one of the lower electrode 11 and the upper electrode 13 is patterned, so that the area of the capacitor 10, that is, the area at which the upper electrode 13 and the lower electrode 11 are overlapped with each other when viewed in plan, is set to 1 mm square.

First, the leak current of the capacitor 10 formed by the method described above was measured. Subsequently, after the capacitor 10 thus measured was processed by a heat treatment at 400° C. for 30 minutes in a hydrogen atmosphere, the leak current was again measured. The heat treatment in a hydrogen atmosphere is one example of the second heat treatment performed after the upper electrode 13 is laminated. The heat treatment in a hydrogen atmosphere is also called a hydrogen anneal. In this case, after the chamber in which the heat treatment is to be performed was once vacuumed, a hydrogen gas having a high purity was charged into the chamber until the pressure reached one atmospheric pressure. In addition, the vacuum in this case indicates a state at a pressure of $10^{-2}$ Pa or less.

Figure 2:
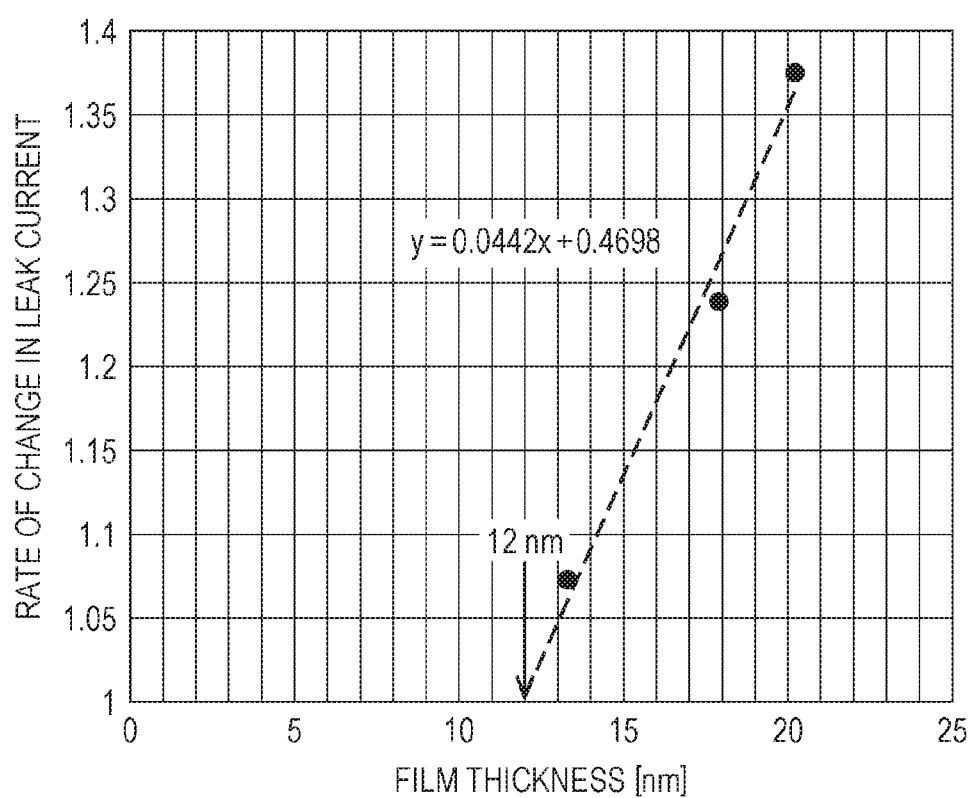
FIG. 2 is a graph showing the rate of change in leak current of the capacitor before and after a heat treatment in a hydrogen atmosphere with respect to the film thickness of a dielectric layer of the capacitor of the embodiment.

FIG. 2 is a graph showing the rate of change in leak current of the capacitor 10 before and after the heat treatment in a hydrogen atmosphere with respect to the film thickness of the dielectric layer 12 of the capacitor 10 according to this embodiment. In FIG. 2, the vertical axis represents the rate of change in leak current. The horizontal axis represents the film thickness of the dielectric layer 12. The rate of change in leak current is represented by the value obtained by dividing the leak current after the heat treatment in a hydrogen atmosphere by the leak current before the heat treatment in a hydrogen atmosphere.

From FIG. 2, it is found that as the film thickness of $HfO_x$ is increased, the leak current measured after the heat treatment in a hydrogen atmosphere is increased. In addition, in the measurement of the leak current, the lower electrode 11 was used as a common terminal, and after 20 seconds from the start of applying a direct current voltage of 3 V to the upper electrode 13, the current flowing at an upper electrode 13 side was measured. In addition, for the measurement of the leak current, a semiconductor parameter analyzer 4156C manufactured by Keysight was used.

In addition, in FIG. 2, the leak currents of four capacitors 10 each having a thickness of 13.5 nm, 18 nm, or 20 nm were measured, and the central value obtained thereby was plotted. In FIG. 2, a linear approximation curve of the plotted three points is shown by a dotted line. As a result, it is found that when the film thickness is 12 nm or more, the leak current is increased by the heat treatment in a hydrogen atmosphere.

Next, a method to decrease the leak current which is increased by the heat treatment in a hydrogen atmosphere will be described. First, the present inventors performed a heat treatment in a nitrogen atmosphere on the capacitor 10 processed by the heat treatment in a hydrogen atmosphere. The heat treatment in a nitrogen atmosphere is also called a nitrogen anneal. Hereinafter, the change in leak current measured before and after the heat treatment in a nitrogen atmosphere will be described with reference to FIG. 3.

Figure 3:
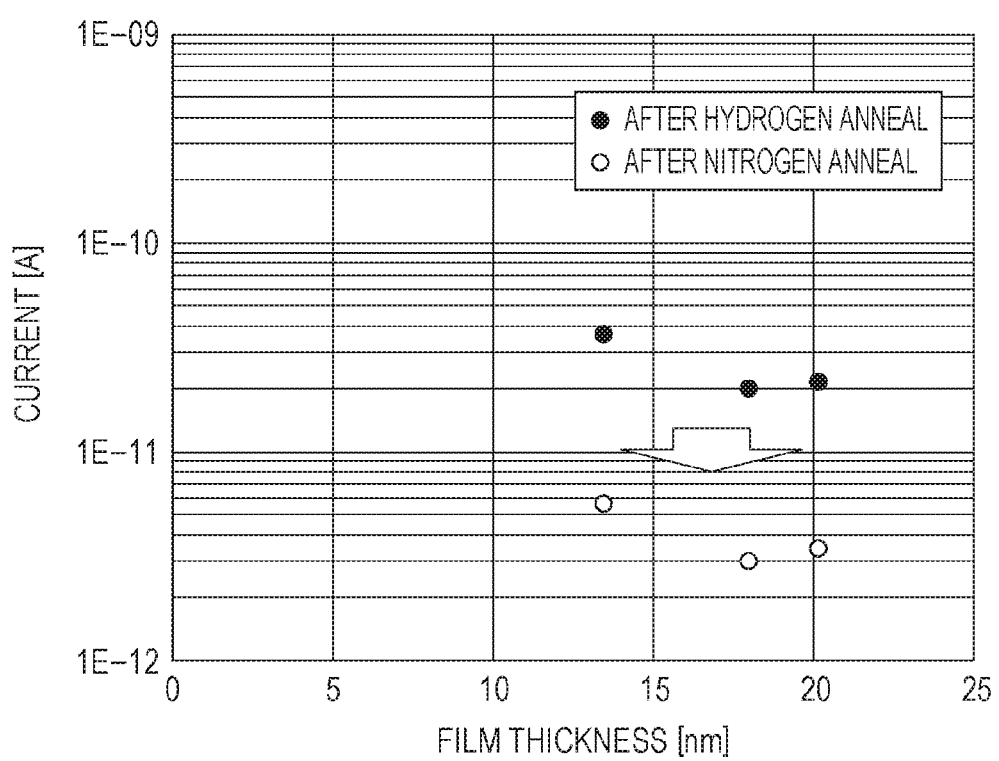
FIG. 3 is a graph showing the change in leak current of the capacitor processed by the heat treatment in a hydrogen atmosphere shown in FIG. 2 before and after a heat treatment in a nitrogen atmosphere.

FIG. 3 is a graph showing the change in leak current of the capacitor 10 processed by the heat treatment in a hydrogen atmosphere shown in FIG. 2 before and after the heat treatment in a nitrogen atmosphere. In FIG. 3, the vertical axis represents the leak current [A]. The horizontal axis represents the film thickness [nm]. In FIG. 3, the data shown by the black circle represents the leak current of the capacitor 10 after the heat treatment in a hydrogen atmosphere and before the heat treatment in a nitrogen atmosphere, and the data shown by the white circle represents the leak current of the capacitor 10 after the heat treatment in a nitrogen atmosphere.

In this case, on the capacitor 10 in which the leak current was increased by the heat treatment in a hydrogen atmosphere, the heat treatment was performed at 400° C. for 30 minutes in a nitrogen atmosphere. Before and after the above heat treatment, the leak current of the capacitor 10 was measured.

The heat treatment in a nitrogen atmosphere is one example of the first heat treatment which is performed in an atmosphere excluding hydrogen after at least a part of the dielectric layer 12 is laminated. In this case, similar to the above hydrogen gas conditions, after the chamber was once vacuumed, a nitrogen gas was charged thereinto until the pressure reached one atmospheric pressure. The vacuum in this case indicates a state at a pressure of $10^{-2}$ Pa or less.

From FIG. 3, it is found that by the heat treatment in a nitrogen atmosphere, regardless of the film thickness of the dielectric layer 12, the leak current is decreased. When the heat treatment in a nitrogen atmosphere is performed, the leak current before the heat treatment is decreased by approximately one digit. In addition, as for the plotting at each film thickness shown in FIG. 3, the central value of the measurement results of the four capacitors 10 is plotted. In addition, as the measurement values before and after the heat treatment in a nitrogen atmosphere, the measurement results obtained from the same element were used.

Next, the present inventors investigated the change in leak current of the capacitor 10 by changing the order of the heat treatment in a hydrogen atmosphere and the heat treatment in a nitrogen atmosphere. Hereinafter, the change in leak current caused by changing the order of the heat treatments will be described with reference to FIGS. 4 and 5.

Figure 4:
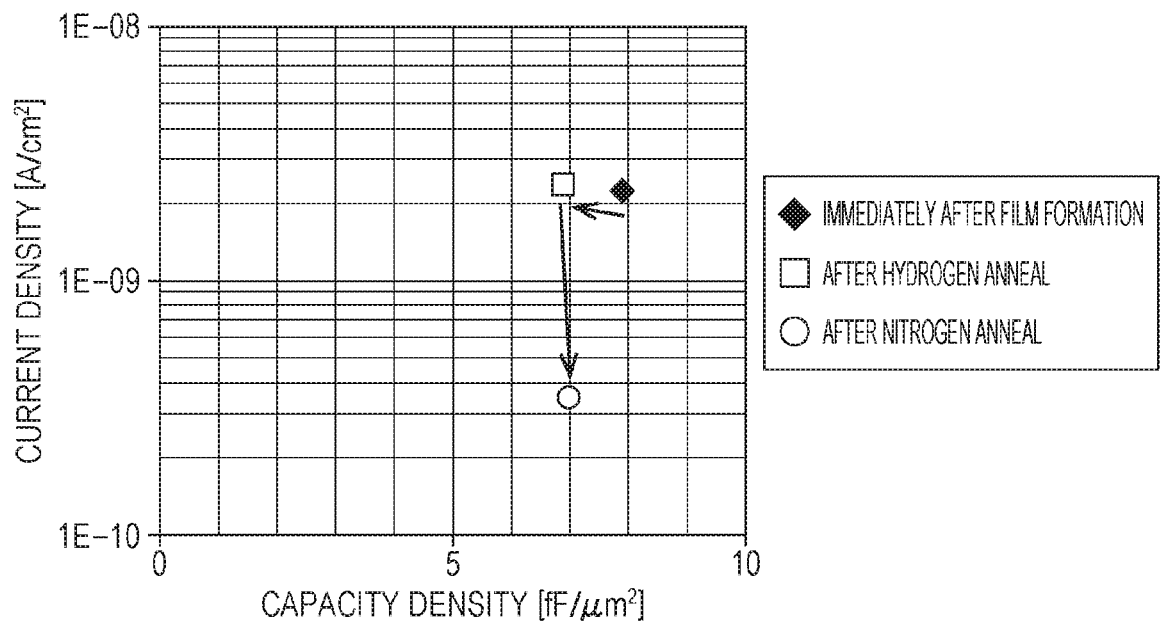
FIG. 4 is a graph showing the leak current of the capacitor after each treatment in the case in which a film formation treatment of a dielectric layer having a film thickness of 20 nm of the capacitor according to the embodiment, a heat treatment in a hydrogen atmosphere, and a heat treatment in a nitrogen atmosphere are performed in this order.

First, as is the case shown in FIG. 3, the case in which after the heat treatment in a hydrogen atmosphere is performed, the heat treatment in a nitrogen atmosphere is performed will be described with reference to FIG. 4. FIG. 4 is a graph showing the leak current of the capacitor after each treatment in the case in which a film formation treatment of a dielectric layer 12 having a film thickness of 20 nm of the capacitor 10 according to this embodiment, the heat treatment in a nitrogen atmosphere, and the heat treatment in a hydrogen atmosphere are performed in this order. In FIG. 4, the vertical axis represents the current density [A/cm²] of the leak current. The horizontal axis represents the capacity density [fF/μm²] of the capacitor 10. In FIG. 4, the rhombus represents the data of the capacitor 10 immediately after the film formation of the dielectric layer 12, the square represents the data of the capacitor 10 after the heat treatment in a hydrogen atmosphere, and the white circle represents the data of the capacitor 10 after the heat treatment in a nitrogen atmosphere.

In this case, the capacity density and the current density of the capacitor 10 were each measured three times, that is, immediately after the film formation of the dielectric layer 12, after the heat treatment in a hydrogen atmosphere, and after the heat treatment in a nitrogen atmosphere. As shown in FIG. 4, the leak current is once increased by the heat treatment in a hydrogen atmosphere as compared to that measured immediately after the film formation. However, when the heat treatment in a nitrogen atmosphere is then performed, the leak current is decreased by approximately 70% from that obtained immediately after the film formation. This is the same result as that described with reference to FIGS. 2 and 3.

In addition, for example, before the formation of the capacitor 10, the heat treatment in a hydrogen atmosphere may be performed. Accordingly, in the periphery of the region in which the capacitor 10 is formed, a material having a high hydrogen gettering ability is contained. In this case, as is the case described above, when the heat treatment in a nitrogen atmosphere is performed, the leak current can be decreased. In particular, it is believed that during or after the formation of the capacitor 10, hydrogen diffuses from the material having a high hydrogen gettering ability to the capacitor 10, so that the leak current of the capacitor 10 may be increased in some cases. On the other hand, when the heat treatment in a nitrogen atmosphere is performed, this increase in leak current can be suppressed.

Figure 5:
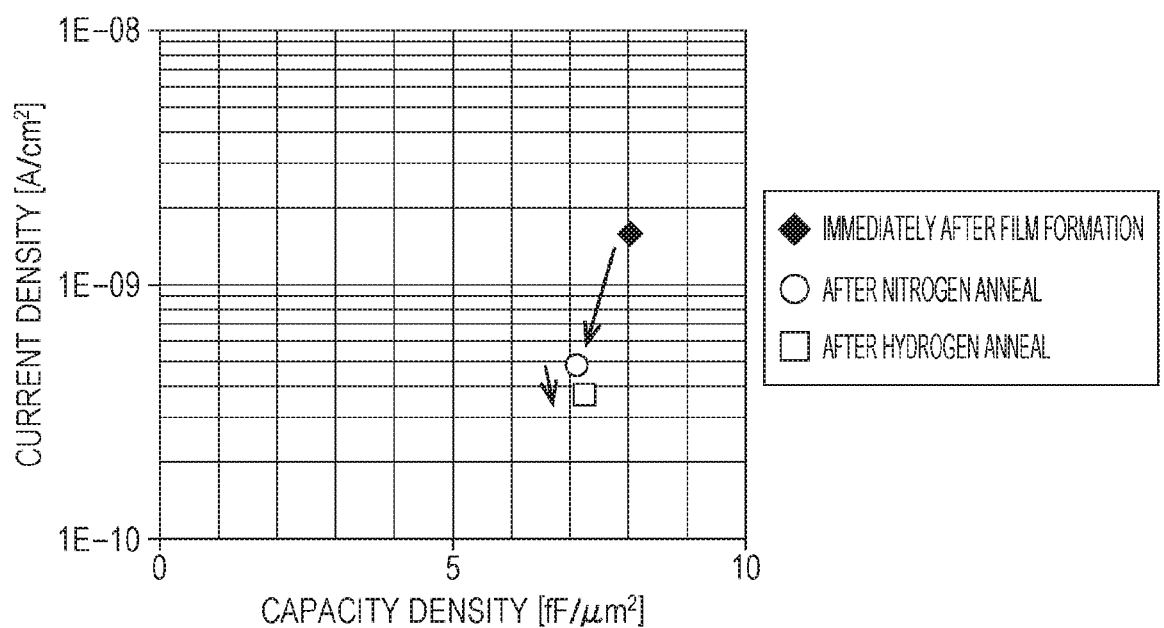
FIG. 5 is a graph showing the leak current of the capacitor after each treatment in the case in which a film formation treatment of a dielectric layer having a film thickness of 20 nm of the capacitor according to the embodiment, a heat treatment in a nitrogen atmosphere, and a heat treatment in a hydrogen atmosphere are performed in this order.

Next, the case in which after the heat treatment in a nitrogen atmosphere, the heat treatment in a hydrogen atmosphere is performed will be described with reference to FIG. 5. FIG. 5 is a graph showing the leak current of the capacitor 10 after each treatment in the case in which a film formation treatment of a dielectric layer 12 having a film thickness of 20 nm of the capacitor 10 according to this embodiment, the heat treatment in a nitrogen atmosphere, and the heat treatment in a hydrogen atmosphere are performed in this order. In FIG. 5, the vertical axis represents the current density [A/cm$^2$] of the leak current. The horizontal axis represents the capacity density [fF/μm$^2$] of the capacitor 10. In FIG. 5, the rhombus represents the data of the capacitor 10 immediately after the film formation of the dielectric layer 12, the white circle represents the data of the capacitor 10 after the heat treatment in a nitrogen atmosphere, and the square represents the data of the capacitor 10 after the heat treatment in a hydrogen atmosphere.

As is the case shown in FIG. 4, the capacity density and the current density of the capacitor 10 were each measured three times, that is, immediately after the film formation of the dielectric layer 12, after the heat treatment in a nitrogen atmosphere, and after the heat treatment in a hydrogen atmosphere. As shown in FIG. 5, it is found that the leak current is decreased by performing the heat treatment in a nitrogen atmosphere after the film formation of the dielectric layer 12. In addition, it is also found that even when the capacitor 10 in which the leak current is once decreased by the heat treatment in a nitrogen atmosphere is then processed by the heat treatment in a hydrogen atmosphere, the increase in leak current described with reference to FIG. 2 does not occur. In other words, when the heat treatment in a nitrogen atmosphere is performed in advance, even if the heat treatment in a hydrogen atmosphere is then performed, the increase in leak current can be suppressed.

As described above, regardless of whether the heat treatment in a hydrogen atmosphere or the heat treatment in a nitrogen atmosphere is performed first than the other, the leak current can be decreased. That is, regardless of the order of the heat treatment in a hydrogen atmosphere and the heat treatment in a nitrogen atmosphere, when the two types of heat treatments are performed, the leak current of the capacitor 10 can be decreased.

Hereinafter, the physical properties of the dielectric layer 12 of the capacitor 10 according to this embodiment will be described.

The present inventors measured the concentration of hydrogen contained in the dielectric layer 12 by a ToF-SIMS. First, the measurement result of the concentration of hydrogen will be described with reference to FIG. 6.

Figure 6:
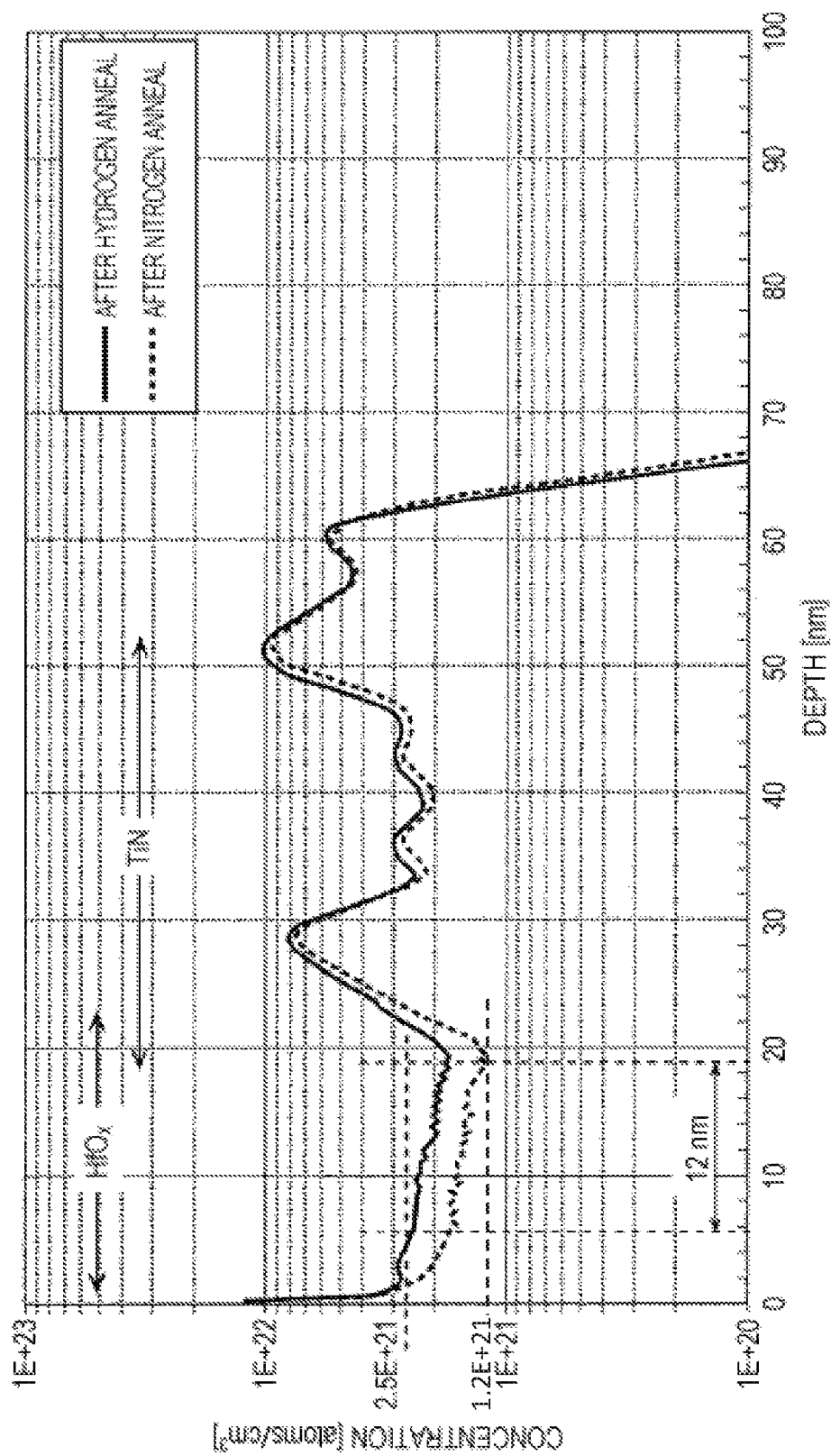
FIG. 6 is a graph showing the concentration of hydrogen contained in a capacitor processed only by a heat treatment in a hydrogen atmosphere and the concentration of hydrogen contained in a capacitor only processed by a heat treatment in a nitrogen atmosphere, each capacitor including a dielectric layer having a film thickness of 20 nm.

FIG. 6 is a graph showing the concentration of hydrogen contained in each of a capacitor 10 processed only by the heat treatment in a hydrogen atmosphere and a capacitor 10 processed only by the heat treatment in a nitrogen atmosphere, each capacitor 10 including the dielectric layer 12 having a film thickness of 20 nm. In this case, the concentration of hydrogen was measured using a ToF-SIMS. In addition, the measurement region is a region in which the upper electrode 13 is not formed, that is, a region in which the surface of HfO$_x$ is exposed. In FIG. 6, the solid line represents the concentration of hydrogen contained in the capacitor 10 processed only by the heat treatment in a hydrogen atmosphere, and the dotted line represents the concentration of hydrogen contained in the capacitor 10 processed only by the heat treatment in a nitrogen atmosphere.

As apparent from FIG. 6, the concentration of hydrogen in the HfO$_x$ film of the capacitor 10 processed by the heat treatment in a hydrogen atmosphere is larger than that of the capacitor 10 processed by the heat treatment in a nitrogen atmosphere. In addition, in each capacitor 10, the concentration of hydrogen is decreased along the depth direction. A region at a depth of from 20 to 50 nm corresponds to a TiN film forming the lower electrode 11. The concentration of hydrogen has the minimum value in a region at a depth of from 19 to 20 nm corresponding to the interface between the lower electrode 11 and the dielectric layer 12 and is increased in a region deeper than the region at the minimum value.

As described with reference to FIG. 2, when the thickness of the HfO$_x$ film is 12 nm or more, the leak current is increased by the heat treatment in a hydrogen atmosphere. In FIG. 6, the region from a depth corresponding to the minimum value of the concentration of hydrogen to a depth shallower than that by 12 nm is shown by a dotted line. The maximum value of the concentration of hydrogen in this region is the concentration of hydrogen of the capacitor 10 processed by the heat treatment in a hydrogen atmosphere at a position shallower by 12 nm than the depth corresponding to the minimum value of the concentration. In particular, the maximum concentration is $2.5 \times 10^{21}$ atoms/cm$^3$.

Hence, it may be said that when the concentration of hydrogen in the HfO$_x$ film is larger than $2.5 \times 10^{21}$ atoms/cm$^3$, the leak current of the capacitor 10 is increased. A film thickness of 12 nm and a hydrogen concentration of $2.5 \times 10^{21}$ atoms/cm$^3$ contained in the dielectric layer 12 correspond to the boundary at which an effect of decreasing the leak current originally obtained by the heat treatment and an effect of increasing the leak current caused by hydrogen contained in the HfO$_x$ film are offset to each other.

For example, it is believed that when the film thickness of the dielectric layer 12 is larger than 12 nm, the effect of increasing the leak current caused by hydrogen contained in the HfO$_x$ film is larger than the effect of decreasing the leak current by the heat treatment. In addition, it is also believed that when the concentration of hydrogen contained in the dielectric layer 12 is larger than $2.5 \times 10^{21}$ atoms/cm$^3$, the effect of increasing the leak current caused by hydrogen contained in the HfO$_x$ film is larger than the effect of decreasing the leak current caused by the heat treatment.

Next, the present inventors analyzed the crystalline structure of the dielectric layer 12 using an XRD method. Hereinafter, the result of the analysis will be described with reference to FIG. 7.

Figure 7:
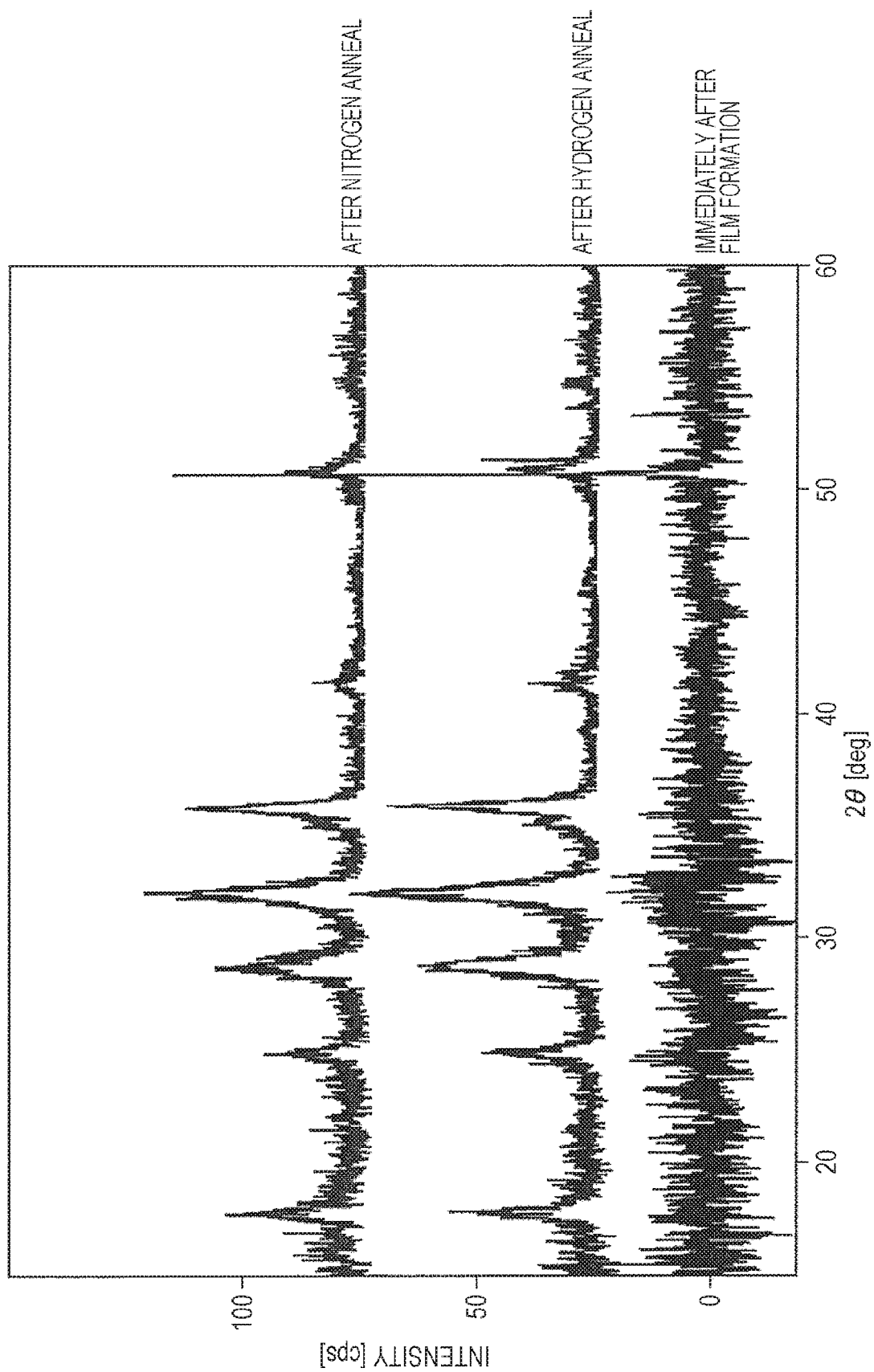
FIG. 7 is a graph showing the diffraction intensity analyzed by XRD of the surface of a dielectric layer of each of a capacitor immediately after film formation of a dielectric layer having a film thickness of 20 nm, a capacitor processed only by a heat treatment in a hydrogen atmosphere, and a capacitor processed only by a heat treatment in a nitrogen atmosphere.

FIG. 7 is a graph showing the diffraction intensity analyzed by XRD of the surface of the dielectric layer 12 of each of the capacitor 10 immediately after the film formation of the dielectric layer 12 having a thickness of 20 nm, the capacitor processed only by the heat treatment in a hydrogen atmosphere, and the capacitor processed only by the heat treatment in a nitrogen atmosphere. In FIG. 7, the vertical axis represents the diffraction intensity. The horizontal axis represents the incident angle. In this case, as is the case of a ToF-SIMS, the analysis region is a region in which the surface of $HfO_x$ is exposed. Since X-ray which is the incident light is set to have a small incident angle, the crystalline structure of the topmost surface of the $HfO_x$ film is analyzed.

As apparent from FIG. 7, the $HfO_x$ film immediately after the film formation by an ALD method has no clear diffraction intensity peaks and is in an amorphous state. On the other hand, regardless of the hydrogen atmosphere and the nitrogen atmosphere, when the heat treatment is performed at 400° C. for 30 minutes, the monoclinic crystal system peaks can be confirmed.

Hence, it may be said that the crystallization of the $HfO_x$ film performed by the heat treatment is independent of the effect of increasing the leak current in accordance with the concentration of hydrogen.

As described above, the capacitor 10 according to this embodiment uses a mechanism in which the leak current is increased by performing the heat treatment in a hydrogen atmosphere, and the increase in leak current is suppressed by performing once the heat treatment in a nitrogen atmosphere. It is believed that the mechanism described above is not caused by the reduction of an oxide film forming the dielectric layer 12 by hydrogen but is caused by the increase in trapping density since the oxide film encloses hydrogen.

If the increase in leak current is assumed to be caused by the reduction of the oxide film by hydrogen, even after the heat treatment in a nitrogen atmosphere is performed, the leak current is to be increased when the heat treatment in a hydrogen atmosphere is performed. However, from FIG. 5, it is found that the phenomenon as described above does not occur.

On the other hand, immediately after the film formation, the $HfO_x$ film has a high defect density. Hence, when the heat treatment in a hydrogen atmosphere is performed, hydrogen is trapped at a defect level, so that the heat treatment may be partially responsible for the increase in trap level. If the assumption described above is true, as the film thickness is increased, the amount of hydrogen trapped in the $HfO_x$ film is simply increased; hence, the above assumption well coincides with the results shown in FIG. 2. Accordingly, when the heat treatment in a nitrogen atmosphere is performed in advance so as to reduce the defect density of the $HfO_x$ film, the amount of hydrogen to be trapped is also decreased. Hence, the increase in leak current of the capacitor 10 can be estimated to be sufficiently suppressed.

Next, the relationship between the temperature of the heat treatment in a nitrogen atmosphere and the decrease in leak current will be described with reference to FIG. 8.

Figure 8:
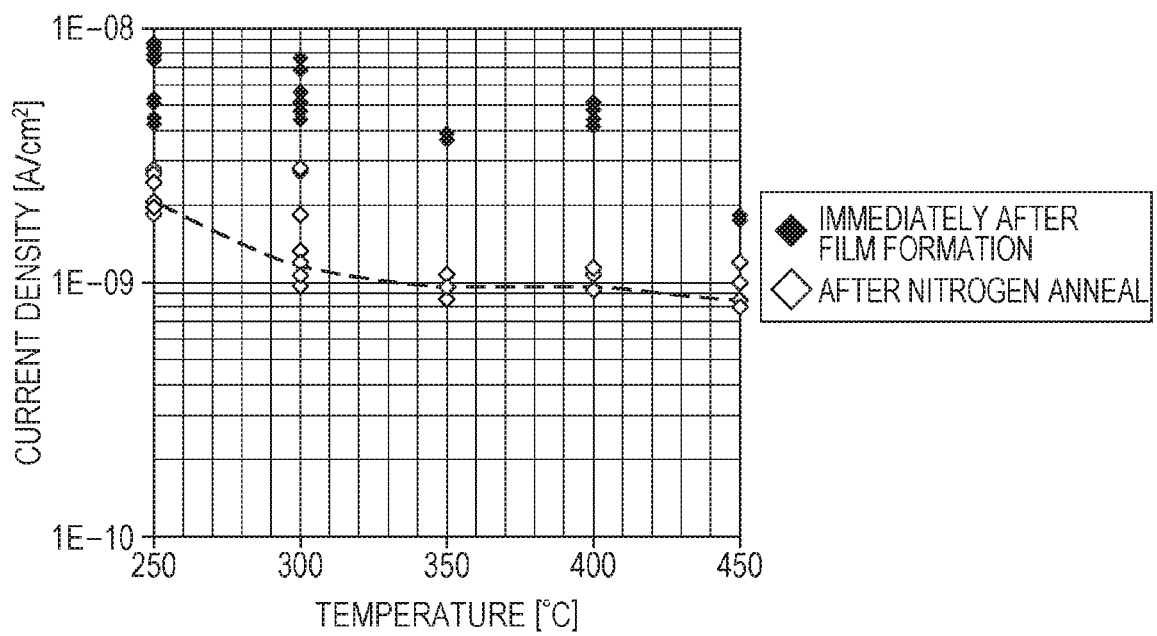
FIG. 8 is a graph showing the change in leak current when the temperature of a heat treatment in a nitrogen atmosphere performed on the capacitor according to the embodiment is changed.

FIG. 8 is a graph showing the change in leak current of the capacitor 10 according to this embodiment obtained when the temperature of the heat treatment in a nitrogen atmosphere is changed. In FIG. 8, the vertical axis represents the current density $[A/cm^2]$ of the leak current. The horizontal axis represents the temperature [° C.] when the heat treatment in a nitrogen atmosphere is performed.

The white rhombus represents the current density of the leak current after the heat treatment in a nitrogen atmosphere. The black rhombus represents the current density of the leak current immediately after the film formation of the dielectric layer 12.

From FIG. 8, it is found that the temperature of the heat treatment in a nitrogen atmosphere may be set to 350° C. or more. In addition, at a temperature of 350° C. or more, the effect of decreasing the leak current is saturated. In addition, the temperature of the heat treatment in a nitrogen atmosphere may be lower than 350° C. As shown in FIG. 8, even when the temperature is 250° C. or 300° C., it is found that the leak current is decreased as compared to that immediately after the film formation of the dielectric layer 12.

Next, the results of research on the heat treatment in an atmosphere other than a nitrogen atmosphere carried out by the present inventors will be described with reference to FIG. 9.

Figure 9:
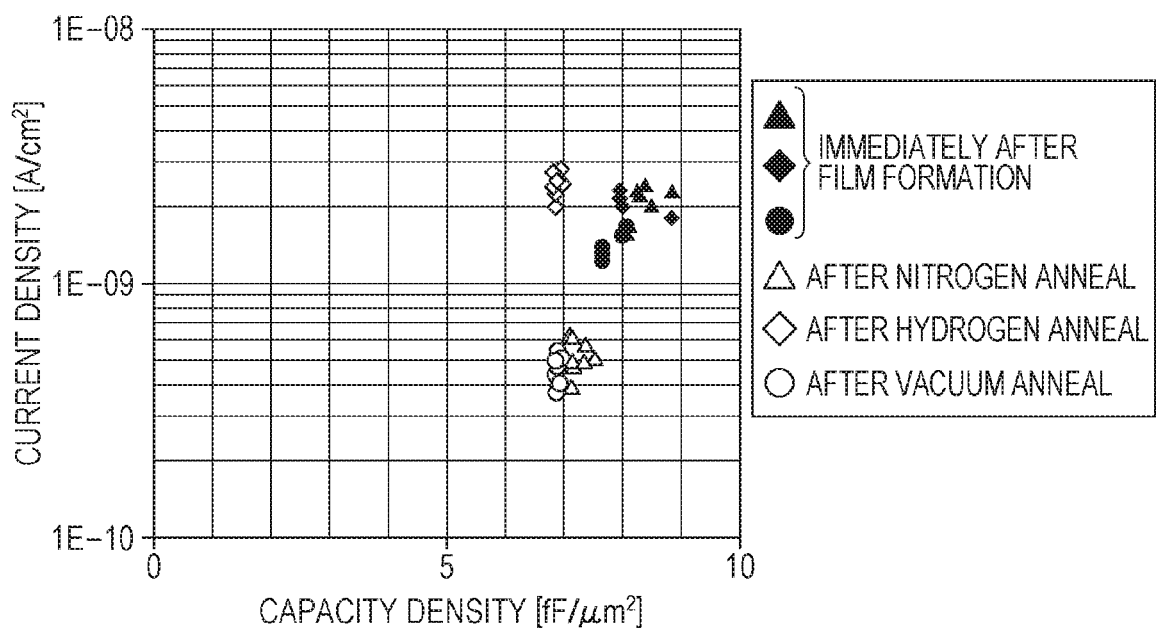
FIG. 9 is a graph showing the leak current of each of a capacitor immediately after film formation of a dielectric layer having a film thickness of 20 nm, a capacitor processed only by a heat treatment in a hydrogen atmosphere, a capacitor processed only by a heat treatment in a vacuum atmosphere, and a capacitor processed only by a heat treatment in a nitrogen atmosphere.

FIG. 9 is a graph showing the leak current of each of the capacitor 10 immediately after the film formation of the dielectric layer 12 having a film thickness of 20 nm, the capacitor processed only by the heat treatment in a hydrogen atmosphere, the capacitor processed only by the heat treatment in a vacuum atmosphere, and the capacitor processed only by the heat treatment in a nitrogen atmosphere. In addition, the heat treatment in a vacuum atmosphere is also called a vacuum anneal. In this case, the vacuum in this case indicates a state at a pressure of $10^{-2}$ Pa or less.

In FIG. 9, the vertical axis represents the current density $[A/cm^2]$ of the leak current. The horizontal axis represents the capacity density $[fF/\mu m^2]$ of the capacitor 10. The white triangle, the while rhombus, and the white circle represent the leak current after the heat treatment in a nitrogen atmosphere, the leak current after the heat treatment in a hydrogen atmosphere, and the leak current after the heat treatment in a vacuum atmosphere, respectively. The black triangle, the black rhombus, and the black circle each represent the leak current before the heat treatment and immediately after the film formation.

From FIG. 9, it is found that the effect of decreasing the leak current obtained by the heat treatment in a nitrogen atmosphere is approximately equivalent to that obtained by the heat treatment in a vacuum atmosphere. Hence, the heat treatment in a nitrogen atmosphere described above is not always required to be performed in a nitrogen atmosphere. In particular, a vacuum atmosphere having a sufficient low hydrogen concentration or an atmosphere containing an inert gas, such as argon, other than hydrogen may also be used. Alternatively, the heat treatment in an atmosphere excluding hydrogen may be a heat treatment in an oxygen atmosphere.

From the results described above, in this embodiment, instead of using a nitrogen atmosphere, the heat treatment in an atmosphere excluding hydrogen may be performed before or after the heat treatment in a hydrogen atmosphere. Accordingly, the leak current of the capacitor 10 can be suppressed.

In consideration of the results described above, a particular example of a method for manufacturing the capacitor 10 according to this embodiment will be described with reference to FIGS. 10 to 14. FIGS. 10 to 14 are flowcharts showing a first to a fourth example of the method for manufacturing the capacitor 10 according to this embodiment, respectively.

In addition, as the basic understanding of the above method, the method for manufacturing the capacitor 10 comprises a step of laminating the lower electrode 11, the dielectric layer 12, and the upper electrode 13 in this order, and after the upper electrode 13 is laminated, a step of performing a heat treatment in a hydrogen atmosphere. That is, the heat treatment in a hydrogen atmosphere of each of the first to the fourth examples is performed after the upper electrode 13 is laminated. In addition, the method for manufacturing the capacitor 10 comprises a step of performing a heat treatment in an atmosphere excluding hydrogen or a reduced pressure atmosphere at $10^{-2}$ Pa or less after at least part of the dielectric layer 12 is laminated.

Hereinafter, the first example of the method for manufacturing the capacitor 10 will be first described with reference to FIG. 10. In the first example, a step of forming the upper electrode 13 is also used as a heat treatment in a nitrogen atmosphere.

Figure 10:
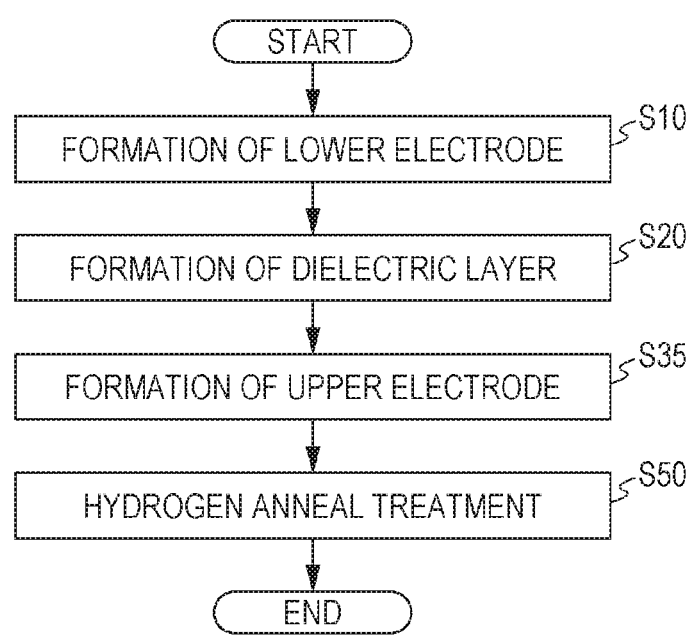
FIG. 10 is a flowchart showing a first example of a method for manufacturing the capacitor according to the embodiment.

As shown in FIG. 10, first, the lower electrode 11 is formed (S10) at an upper side of the substrate. For example, by the use of an MOCVD method, a TiN film having a film thickness of 30 nm is formed as the lower electrode 11.

Next, by the use of an ALD method, the dielectric layer 12 is formed (S20) on the lower electrode 11. In this step, the substrate temperature is, for example, 250° C. to 300° C. For example, a hafnium oxide having a film thickness of 20 nm is formed on the lower electrode 11 as the dielectric layer 12. In addition, instead of the hafnium oxide, a zirconium oxide film may be formed.

Next, by the use of an ALD method, the upper electrode 13 is formed (S35) on the dielectric layer 12. In this step, the substrate temperature is 350° C. or more and is, for example, 370° C. For example, a platinum film is formed as the upper electrode 13, for example, at a reduced pressure of $10^{-2}$ Pa or less, and a heat treatment is performed on the dielectric layer 12. The heat treatment corresponds to the first heat treatment in an atmosphere excluding hydrogen or a reduced pressure atmosphere at $10^{-2}$ Pa or less. That is, in Step S35, while the first heat treatment is performed, the upper electrode 13 is laminated.

When the upper electrode 13 is formed by an ALD method or the like, the substrate temperature may be set, for example, in a range of 350° C. to 400° C. In addition, during the film formation by an ALD method, from a reduced pressure state at $10^{-2}$ Pa or less, a precursor gas, a reaction gas, such as oxygen or nitrogen, and an argon gas functioning as a carrier gas are alternately supplied. Hence, the heat treatment in a reduced pressure atmosphere at $10^{-2}$ Pa or less or an atmosphere excluding hydrogen can be substantially performed.

Finally, the heat treatment in a hydrogen atmosphere is performed (S50) on the capacitor 10. The heat treatment in a hydrogen atmosphere is performed at a temperature of 250° C. or more.

Through the steps described above, the leak current is decreased, and a capacitor 10 having a high insulating property can be manufactured.

Next, the second example of the method for manufacturing the capacitor 10 will be described with reference to FIG. 11. In the second example, the first heat treatment in an atmosphere excluding hydrogen or a reduced pressure atmosphere at $10^{-2}$ Pa or less is performed as a post anneal treatment after the dielectric layer 12 is laminated and before the upper electrode 13 is laminated. For example, in the second example, immediately after the film formation of the $HfO_x$ film, a heat treatment in a reduced pressure atmosphere or an atmosphere excluding hydrogen is performed, and subsequently, the upper electrode 13 is formed.

Figure 11:
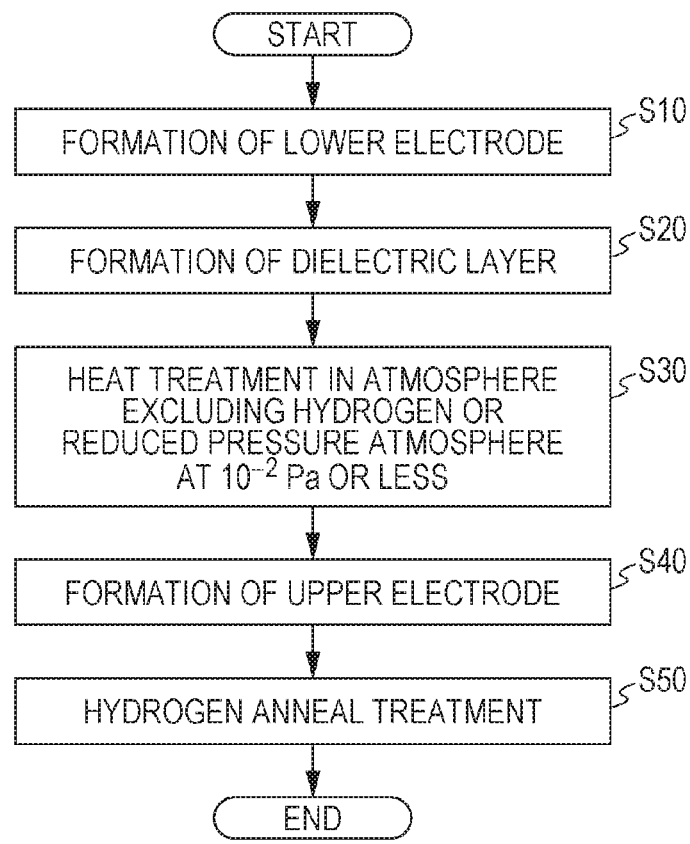
FIG. 11 is a flowchart showing a second example of the method for manufacturing the capacitor according to the embodiment.

In particular, as shown in FIG. 11, first, the lower electrode 11 is formed (S10) at an upper side of the substrate. Subsequently, on the lower electrode 11, by the use of an ALD method, the dielectric layer 12 is formed (S20). In addition, those treatments are the same as those in the first example of the method for manufacturing the capacitor 10.

Next, a heat treatment in an atmosphere excluding hydrogen or a reduced pressure atmosphere at $10^{-2}$ Pa or less is performed (S30). In particular, the heat treatment is performed on the dielectric layer 12 at a temperature of 350° C. The heat treatment is performed in a chamber used for the ALD method.

In this case, at a final step of the film formation of the $HfO_x$ film, the temperature may be increased. In particular, in the film formation of the $HfO_x$ film using an ALD method, after cycles of the supply of the precursor and the supply of the reaction gas are all completed, the substrate temperature may be increased. In addition, in the ALD method, the supply of the precursor is performed at a temperature of 300° C. or less. In addition, the heat treatment in Step S30 may be performed in a chamber different from that in which the ALD method is performed.

Next, the upper electrode 13 is formed (S40) using a sputtering method. For example, at a temperature of 300° C. or less, a platinum film is formed as the upper electrode 13 on the dielectric layer 12.

Finally, the heat treatment in a hydrogen atmosphere is performed (S50) on the capacitor 10. This heat treatment is the same as that of the first example of the method for manufacturing the capacitor 10.

Through the steps described above, the leak current is decreased, and a capacitor 10 having a high insulating property can be manufactured.

Next, in the third example of the method for manufacturing the capacitor 10 will be described with reference to FIG. 12. In the third example, the first heat treatment in an atmosphere excluding hydrogen or a reduced pressure atmosphere at $10^{-2}$ Pa or less is performed after the upper electrode 13 is laminated and before the second heat treatment in a hydrogen atmosphere is performed.

Figure 12:
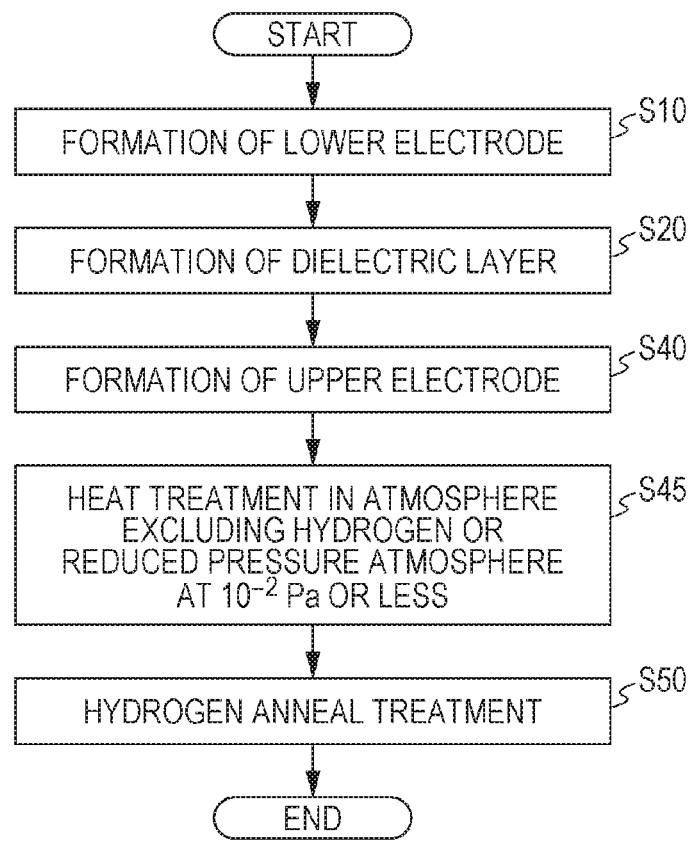
FIG. 12 is a flowchart showing a third example of the method for manufacturing the capacitor according to the embodiment.

In particular, as shown in FIG. 12, first, the lower electrode 11 is formed (S10) at an upper side of the substrate. Subsequently, on the lower electrode 11, by the use of an ALD method, the dielectric layer 12 is formed (S20). Next, on the dielectric layer 12, by the use of a sputtering method, the upper electrode 13 is formed (S40). In addition, those treatments are the same as those in the second example of the method for manufacturing the capacitor 10.

After the upper electrode 13 is formed, a heat treatment in an atmosphere excluding hydrogen or a reduced pressure atmosphere at $10^{-2}$ Pa or less is performed (S45). In particular, the heat treatment is performed at a temperature of 350° C. on the capacitor 10 including the dielectric layer 12. The heat treatment is performed in a chamber in which the sputtering method is performed or in a chamber provided with a different heating device.

Finally, the heat treatment in a hydrogen atmosphere is performed (S50) on the capacitor 10. This heat treatment is the same as that of the first or the second example of the method for manufacturing the capacitor 10.

Through the steps described above, the leak current is decreased, and a capacitor 10 having a high insulating property can be manufactured.

Next, in the fourth example of the method for manufacturing the capacitor 10 will be described with reference to FIG. 13. In the fourth example, the first heat treatment in an atmosphere excluding hydrogen or a vacuum atmosphere is performed after the second heat treatment in a hydrogen atmosphere is performed.

Figure 13:
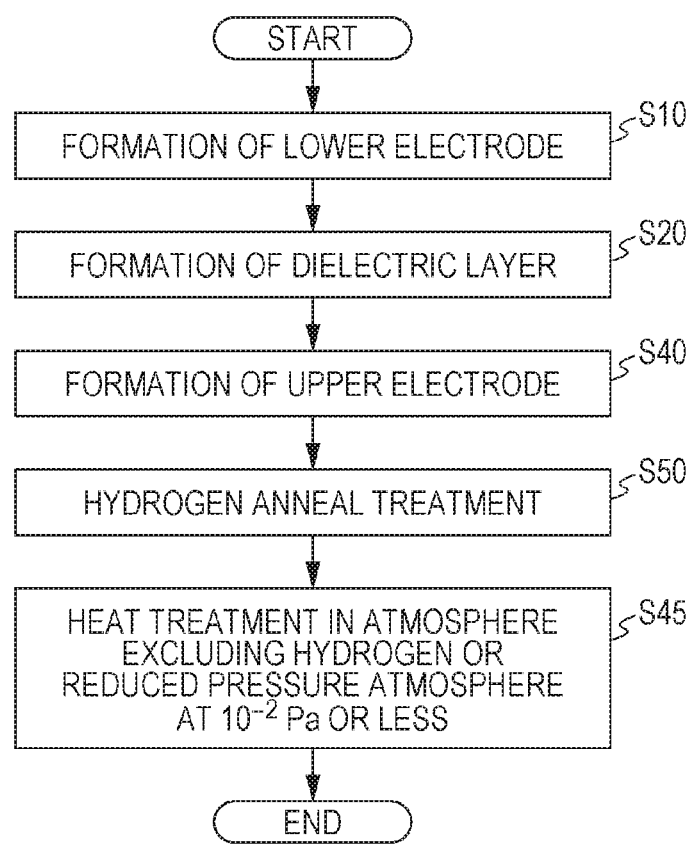
FIG. 13 is a flowchart showing a fourth example of the method for manufacturing the capacitor according to the embodiment.

When the flowchart shown in FIG. 13 is compared with that shown in FIG. 12, it is apparent that in the fourth example shown in FIG. 13, the second heat treatment in a hydrogen atmosphere in Step S50 is performed before the first heat treatment in an atmosphere excluding hydrogen or a reduced pressure atmosphere at $10^{-2}$ Pa or less is performed in Step S45.

Through the steps described above, the leak current is decreased, and a capacitor 10 having a high insulating property can be manufactured.

Figure 14:
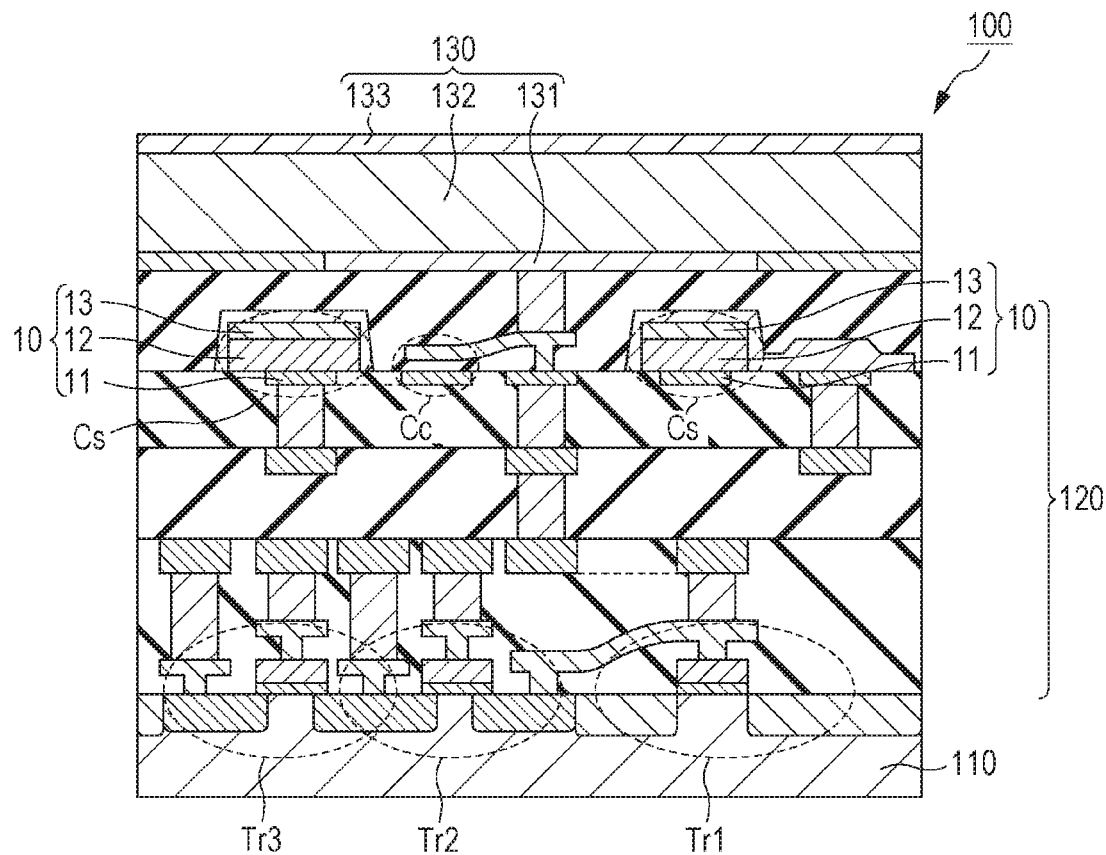
FIG. 14 is a cross-sectional view of the structure of an image sensor including the capacitor according to the embodiment.

Next, an image sensor 100 including the capacitor 10 according to this embodiment will be described with reference to FIG. 14. FIG. 14 is a cross-sectional view of the structure of the image sensor 100 according to this embodiment.

The image sensor 100 includes a plurality of pixels arranged in matrix. Each pixel includes a photoelectric converter generating an electrical signal by photoelectric conversion of received light and a pixel circuit processing the electrical signal generated by the photoelectric converter. In FIG. 14, the cross-sectional structure of one pixel of the image sensor 100 is shown.

As shown in FIG. 14, as one example of the image sensor 100 according to this embodiment, an image sensor is shown which has a laminate structure in which a photoelectric conversion film 132 is laminated at an upper side of a pixel circuit. In particular, the image sensor 100 includes a substrate 110, a multilayer wiring structure 120, and a photoelectric converter 130.

The substrate 110 is a semiconductor substrate and is, for example, a Si substrate.

The multilayer wiring structure 120 includes a pixel circuit processing an electrical signal generated by the photoelectric converter 130. In particular, as shown in FIG. 14, the multilayer wiring structure 120 includes transistors Tr1, Tr2, and Tr3; capacitors Cs and Cc, and wires.

The transistors Tr1, Tr2, and Tr3 are each a reset transistor, a charge readout transistor, or the like. The transistors Tr1, Tr2, and Tr3 are each, for example, a MOSFET. The source region, the drain region, and the like of each transistor are formed in a surface region of the substrate 110.

The capacitor Cc is a capacitor storing signal charges extracted from the photoelectric converter 130. The capacitor Cs is a capacitor removing kTc noise. The transistors, the capacitors, and the wires are separated from each other by an interlayer insulating film, such as a silicon oxide film, formed from an insulating material.

The photoelectric converter 130 includes a pixel electrode 131, the photoelectric conversion film 132, and a transparent electrode 133. The pixel electrode 131 and the transparent electrode 133 are disposed to face each other with the photoelectric conversion film 132 interposed therebetween. The photoelectric conversion film 132 has two surfaces in contact with the pixel electrode 131 and the transparent electrode 133.

The pixel electrode 131 of the pixel is separated from a pixel electrode of another pixel. The pixel electrode 131 is formed, for example, an electrically conductive material, such as a metal, that is, aluminum, copper, or the like.

The photoelectric conversion film 132 is formed using an organic material or an inorganic material, such as amorphous silicon. When light is incident on the photoelectric conversion film 132 through the transparent electrode 133, the photoelectric conversion film 132 generates signal charges corresponding to the amount of incident light. The signal charges are extracted through the pixel electrode 131 and are stored in the capacitor Cc.

The transparent electrode 133 is formed using a transparent electrically conductive material, such as ITO. The transparent electrode 133 and the photoelectric conversion film 132 are commonly provided, for example, in each pixel.

The capacitor 10 according to this embodiment is used, for example, as the capacitor Cs. In particular, as shown in FIG. 14, the image sensor 100 includes the capacitor 10 as the capacitor removing kTC noise. At an upper side of the substrate 110 and in the multilayer wiring structure 120, the lower electrode 11, the dielectric layer 12, and the upper electrode 13 are laminated in this order, so that the capacitor 10 is provided.

In addition, the capacitor 10 may also be used as the capacitor Cc storing signal charges. Accordingly, exposure to incident light having a high luminance can be performed without highlight clipping, and a pixel having many saturated electrons can be realized.

The capacitor 10 may have various use modes other than those described above in the image sensor 100. For example, the capacitor 10 may be used as a capacitor temporarily storing charges. In addition, the capacitor 10 may be connected to a floating diffusion (FD) in the image sensor 100 with a transistor interposed therebetween so as to be selectively used in accordance with the signal charge.

In addition, the capacitor 10 may be provided, besides at the pixel portion of the image sensor 100, at a peripheral circuit portion such as a column circuit. For example, when the capacitor 10 is used as a capacitor of a sample hold circuit, sampling can be performed with a small leak current and less noise.

In the image sensor 100, at a lower side of the capacitor 10, the transistors Tr1, Tr2, and Tr3, which are MOSFETs, are provided. Hence, after the capacitors 10 are formed, in order to recover the characteristics of the MOSFETs, a heat treatment in a hydrogen atmosphere is performed. However, as described above, the heat treatment in a hydrogen atmosphere increases the leak current of the capacitor 10.

Accordingly, as described above, in this embodiment, before or after the heat treatment in a hydrogen atmosphere, when a heat treatment in an atmosphere excluding hydrogen or a reduced pressure atmosphere at $10^{-2}$ Pa or less is performed, the leak current of the capacitor 10 can be decreased. Hence, a capacitor 10 having a high insulating property can be realized. In addition, since the image sensor 100 includes the capacitors 10 each having a high insulating property, the reliability can be enhanced.

When an organic material is used for the photoelectric conversion film 132, the second heat treatment in a hydrogen atmosphere and the first heat treatment in an atmosphere excluding hydrogen or a reduced pressure atmosphere at $10^{-2}$ Pa or less to be performed on the capacitor 10 may be performed before the photoelectric conversion film 132 is formed. In particular, a step of forming the photoelectric conversion film 132 may be performed after the heat treatment (S50) in a hydrogen atmosphere of the manufacturing method shown in FIG. 10, after the heat treatment (S50) in a hydrogen atmosphere of the manufacturing method shown in FIG. 11, after the heat treatment (S50) in a hydrogen atmosphere of the manufacturing method shown in FIG. 12, or after the heat treatment (S45) in an atmosphere excluding hydrogen or a reduced pressure atmosphere at $10^{-2}$ Pa or less of the manufacturing method shown in FIG. 13.

In the case as described above, even when an organic material having a low heat resistance or an organic material having a high reactivity with hydrogen is used for the photoelectric conversion film 132, the change and the degradation of the characteristics of the photoelectric conversion film 132 caused by the formation of the capacitor 10 are not generated. In this case, the capacitors 10 are provided between the transistors Tr1, Tr2, and Tr3, which are MOSFETs, and the photoelectric conversion film 132.

In addition, when amorphous silicon is used for the photoelectric conversion film 132, the second heat treatment in a hydrogen atmosphere on the capacitor 10 can also be used as a treatment step of performing hydrogen termination of dangling bonds of the amorphous silicon film. In particular, the step of performing hydrogen termination of dangling bonds of the photoelectric conversion film 132 formed of amorphous silicon may be simultaneously performed with the heat treatment (S50) in a hydrogen atmosphere of the manufacturing method shown in each of FIGS. 10 to 13. Accordingly, the number of the heat treatment steps can be reduced, and at the same time, an amorphous silicon film having a small number of defects can be obtained.

When amorphous silicon is used for the photoelectric conversion film 132, although provided at an upper side of the transistors Tr1, Tr2, and Tr3, which are MOSFETs, the capacitors 10 may be provide either at an upper side or a lower side of the photoelectric conversion film 132. That is, the step of forming the photoelectric conversion film 132 from amorphous silicon is performed before the step (S10) of forming the lower electrode 11 of the manufacturing method shown in FIG. 10, after the step (S35) of forming the upper electrode 13 of the manufacturing method shown in FIG. 10, before the step (S10) of forming the lower electrode 11 of the manufacturing method shown in each of FIGS. 11 to 13, or after the step (S40) of forming the upper electrode 13 of the manufacturing method shown in each of FIGS. 11 to 13.

In addition, all or some of the transistors Tr1, Tr2, and Tr3 may be replaced by at least one thin film transistor (TFT). The TFT is not limited by the position of the Si substrate and may be formed at any position, such as at a lower side or an upper side of the capacitor 10 or at a lower side or an upper side of the photoelectric conversion film 132. For the semiconductor layer of the TFT, an organic semiconductor material, hydrogenated amorphous silicon, or an oxide semiconductor material, such as InGaZnO or InAlGaZnO may be used.

When an organic material having a high reactivity with hydrogen or an oxide semiconductor material is used for the semiconductor layer of the TFT, the TFT may be formed after the capacitor 10 is formed. In particular, a step of forming the TFT may be performed after the heat treatment (S50) in a hydrogen atmosphere of the manufacturing method shown in each of FIGS. 10 to 13. In this case, a transistor having a TFT structure among the transistors Tr1, Tr2, and Tr3 is provided at an upper side of the capacitor 10.

In addition, the image sensor 100 is not limited to the structure having the photoelectric converter 130 and may have the structure in which a light receiving region is formed in the substrate, that is, may have a photodiode. In addition, the image sensor 100 may include both the photoelectric converter 130 and a photodiode. Even when the image sensor 100 includes a photodiode, as is the case including the photoelectric converter 130, the capacitor 10 may have various use modes.

When the image sensor 100 includes a photodiode, a semiconductor substrate including a plurality of photodiodes and a semiconductor substrate having a signal processing circuit formed of a plurality of transistors may be adhered to each other. The structure as described above is the structure called a vertical chip stack as disclosed in Japanese Unexamined Patent Application Publication No. 2016-181935. In this case, "the semiconductor substrates are adhered to each other" includes the case in which the semiconductor substrates are directly adhered to each other and also includes the case in which semiconductor substrates provided with multilayer wiring structures are adhered to each other with the multilayer wiring structures interposed therebetween.

In the case described above, at least one of the second heat treatment in a hydrogen atmosphere and the first heat treatment in an atmosphere excluding hydrogen or a reduced pressure atmosphere at $10^{-2}$ Pa or less to be performed on the capacitor 10 according to this embodiment may be performed after the two semiconductor substrates are adhered to each other. In particular, a step of adhering the semiconductor substrate including photodiodes and the semiconductor substrate having a signal processing circuit to each other may be performed between the step (S35) of forming the upper electrode 13 and the heat treatment (S50) in a hydrogen atmosphere of the manufacturing method shown in FIG. 10, between the step (S40) of forming the upper electrode 13 and the heat treatment (S50) in a hydrogen atmosphere of the manufacturing method shown in FIG. 11, between the step (S40) of forming the upper electrode 13 and the heat treatment (S45) in an atmosphere excluding hydrogen or a reduced pressure atmosphere at $10^{-2}$ Pa or less of the manufacturing method shown in FIG. 12, or between the step (S40) of forming the upper electrode 13 and the heat treatment (S50) in a hydrogen atmosphere of the manufacturing method shown in FIG. 13.

In addition, the capacitors 10 may be formed either in one of the multilayer wiring structures formed on the respective two semiconductor substrates or in the two multilayer wiring structures formed thereon, and when the capacitors 10 are formed in the two multilayer wiring structures, after the substrates are adhered to each other, the second heat treatment in a hydrogen atmosphere and the first heat treatment in an atmosphere excluding hydrogen or a reduced pressure atmosphere at $10^{-2}$ Pa or less are performed, so that capacitors each having a small leak current can be simultaneously obtained.

OTHER EMBODIMENTS

Heretofore, although the capacitor, the image sensor, and the method for manufacturing a capacitor according to one or more embodiments have thus been described, the present disclosure is not limited to those embodiments. An embodiment obtained by variously modification of at least one of the above embodiments performed by a person skilled in the art and an embodiment obtained by using constituent elements of the different embodiments in combination are also included in the present disclosure as long as within the scope thereof.

For example, the capacitor 10 is not required to be a parallel plate type capacitor. A capacitor according to a modified example of the embodiment will be descried with reference to FIG. 15.

Figure 15:
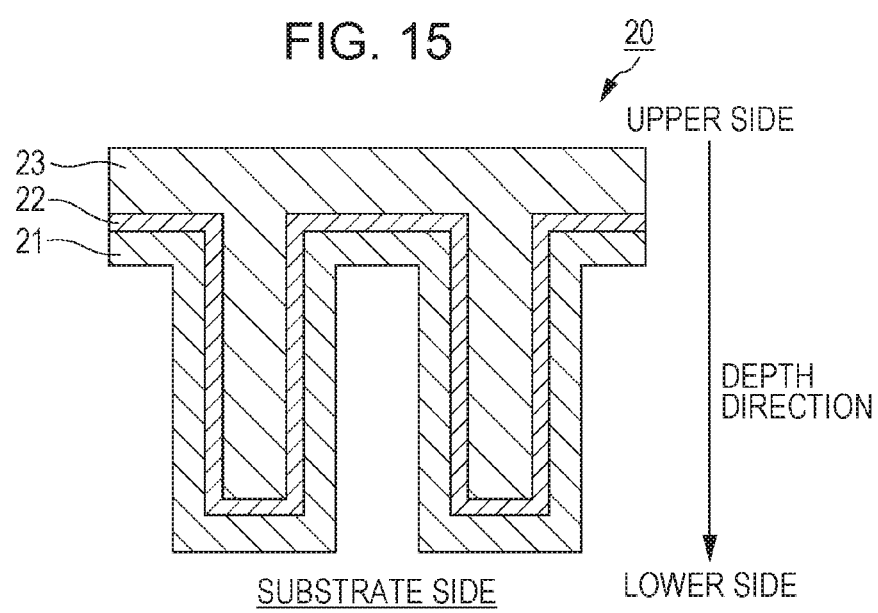
FIG. 15 is a cross-sectional view showing an exemplary structure of a capacitor according to a modified example of the embodiment.

FIG. 15 is a cross-sectional view showing an exemplary structure of a capacitor 20 according to this modified example. The capacitor 20 shown in FIG. 15 is not a parallel plate type capacitor and is a three-dimensional capacitor. In particular, the capacitor 20 includes a lower electrode 21, a dielectric layer 22, and an upper electrode 23. In addition, compared to the capacitor 10 of the above embodiment, the capacitor 20 is similar to the capacitor 10 of the embodiment in terms of the materials forming the layers, the manufacturing method, and the like except for the cross-sectional structure.

As shown in FIG. 15, the interface between the lower electrode 21 and the dielectric layer 22 has a trench shape having a groove in a direction from the upper electrode 23 to the lower electrode 21, that is, in a depth direction. The dielectric layer 22 is provided to have an approximately uniform thickness along the trench shape. In this modified example, the lower electrode 21 is also provided along the trench shape to have an approximately uniform thickness. The upper electrode 23 has an approximately flat upper surface, and the lower surface of the upper electrode 23 is provided along the trench shape.

Accordingly, along a side surface portion of the groove of the trench shape, a region in which the upper electrode 23 and the lower electrode 21 face each other is increased. Hence, when viewed in plan, although the size of the capacitor 20 is the same as that of the capacitor 10 shown in FIG. 1, the surface area of the capacitor 20 is increased, so that the capacity thereof is increased.

In addition, in FIG. 15, although one example in which a trench shape having two grooves is shown, the number of grooves may be one or may be three or more. In addition, when the number of grooves is increased or when the depth of the groove is increased, the capacity of the capacitor 20 can be increased.

In addition, the embodiments described above may be variously changed, replaced, added, omitted, and the like within the scope of the claims or the scope equivalent thereto.

What is claimed is:

1. A capacitor comprising:
a first electrode;
a second electrode facing the first electrode; and
a dielectric layer which is disposed between the first electrode and the second electrode, wherein
the dielectric layer is made of at least one selected from the group consisting of a hafnium oxide and a zirconium oxide,
a thickness of the dielectric layer is 12 nm or more,
the dielectric layer contains hydrogen, and
a concentration of hydrogen in the dielectric layer is $2.5 \times 10^{21}$ atoms/cm$^3$ or less.

2. The capacitor according to claim 1, wherein,
the dielectric layer has a monoclinic crystal system structure.

3. An image sensor comprising:
at least one selected from the group consisting of a photoelectric converter and a photodiode; and
the capacitor according to claim 1.

4. The image sensor according to claim 3, further comprising:
a first semiconductor substrate in which the photodiode is formed; and
a second semiconductor substrate in which a signal processing circuit is formed, wherein
the first semiconductor substrate adheres to the second semiconductor substrate.

5. A method for manufacturing a capacitor, the method comprising:
laminating a first electrode, a dielectric layer which is made of at least one selected from the group consisting of a hafnium oxide and a zirconium oxide and which has a film thickness of 12 nm or more, and a second electrode in this order;
after at least a part of the dielectric layer is laminated, performing a first heat treatment in an atmosphere excluding hydrogen or a reduced pressure atmosphere at $10^{-2}$ Pa or less; and
after the second electrode is laminated, performing a second heat treatment in a hydrogen atmosphere, wherein
in the laminating, while the first heat treatment is performed, the second electrode is laminated.

6. The method according to claim 5, wherein in the laminating, the second electrode is laminated using an atomic layer deposition method.

7. The method according to claim 5, wherein
the second electrode is laminated at a temperature of 300° C. or less using a sputtering method.

8. The method according to claim 5, wherein
in the laminating, the dielectric layer is laminated on the first electrode at a temperature of 300° C. or less using an atomic layer deposition method.

9. The method according to claim 5, wherein
in the laminating, a precursor of the dielectric layer is supplied at a temperature of 300° C. or less using an atomic layer deposition method, and
the first heat treatment is performed after the supply of the precursor is completed.

10. The method according to claim 5, wherein
the first heat treatment is performed at a temperature of 350° C. or more.

11. A method for manufacturing an image sensor, the method comprising:
manufacturing a capacitor according to the method of claim 5; and
after the first heat treatment and the second heat treatment are performed, forming a photoelectric conversion film containing an organic material.

12. The method according to claim 11, further comprising:
after the second heat treatment is performed, forming a thin film transistor.

13. A method for manufacturing a capacitor, the method comprising:
laminating a first electrode, a dielectric layer which is made of at least one selected from the group consisting of a hafnium oxide and a zirconium oxide and which has a film thickness of 12 nm or more, and a second electrode in this order, wherein the dielectric layer is in direct contact with the first electrode and the second electrode;
after at least a part of the dielectric layer is laminated, performing a first heat treatment in an atmosphere excluding hydrogen or a reduced pressure atmosphere at $10^{-2}$ Pa or less; and
after the second electrode is laminated, performing a second heat treatment in a hydrogen atmosphere, wherein
the first heat treatment is performed after the dielectric layer is laminated and before the second electrode is laminated.

14. A method for manufacturing a photoelectric conversion device, the method comprising:
laminating a first electrode, a dielectric layer which is made of at least one selected from the group consisting of a hafnium oxide and a zirconium oxide and which has a film thickness of 12 nm or more, and a second electrode in this order;
after at least a part of the dielectric layer is laminated, performing a first heat treatment in an atmosphere excluding hydrogen or a reduced pressure atmosphere at $10^{-2}$ Pa or less;
after the second electrode is laminated, performing a second heat treatment in a hydrogen atmosphere, wherein the first heat treatment is performed after the dielectric layer is laminated and before the second electrode is laminated; and after the first heat treatment and the second heat treatment are performed, forming a photoelectric conversion film.

15. The method according to claim 14, wherein the photoelectric conversion film contains an organic material.

* * * * *